United States Patent [19]
Yoshida

[11] Patent Number: 5,117,147
[45] Date of Patent: May 26, 1992

[54] PIEZOELECTRIC VIBRATING DEVICE

[75] Inventor: Ryuhei Yoshida, Nagaokakyo, Japan

[73] Assignee: Murata Manufacturing Co., Ltd., Kyoto, Japan

[21] Appl. No.: 649,668

[22] Filed: Feb. 1, 1991

[51] Int. Cl.$^5$ .............................. H01L 41/08
[52] U.S. Cl. .................. 310/320; 310/365; 310/358
[58] Field of Search ............... 310/320, 365, 366, 357, 310/312

[56] References Cited

U.S. PATENT DOCUMENTS 4,468,582 8/1984 Fujiwara ..................... 310/365 X

FOREIGN PATENT DOCUMENTS 45-20226 9/1970 Japan ........................... 310/365
918652 2/1963 United Kingdom ............. 310/365

*Primary Examiner*—Mark O. Budd
*Attorney, Agent, or Firm*—Heller, Ehrman, White, McAuliffe

[57] ABSTRACT

A piezoelectric vibrating device utilizing a thickness shear vibration mode, in which at least one pair of vibrating electrodes is formed on both major surfaces of a piezoelectric substrate so as to have regions opposed to each other through the piezoelectric substrate and an edge of the vibrating electrode on one of the major surfaces which exists in the region opposed to the vibrating electrode on the other major surface is provided with irregularities.

6 Claims, 4 Drawing Sheets

PIEZOELECTRIC VIBRATING DEVICE

BACKGROUND OF THE INVENTION

1. Field of the Invention

The present invention relates generally to a piezoelectric vibrating device utilizing a thickness shear vibration mode which is used as, for example, a piezoelectric resonator or a piezoelectric filter, and more particularly, to a piezoelectric vibrating device having a structure in which the production rate of ripples in a band is reduced by improving the shape of vibrating electrodes.

2. Description of the Prior Art

FIG. 2 shows one example of a conventional piezoelectric vibrating device utilizing a thickness shear vibration mode. The piezoelectric vibrating device 1 has a structure in which vibrating electrodes 3 and 4 are formed on both major surfaces of a piezoelectric substrate 2 having a rectangular plane shape which is subjected to polarization processing in the direction of an arrow P. The vibrating electrodes 3 and 4 are formed so as to be opposed to each other through the piezoelectric substrate 2 in a central region of the piezoelectric substrate 2. The vibrating electrode 3 is extended from one end 2a of the piezoelectric substrate 2 to the center, while the other vibrating electrode 4 is extended from the other end 2b of the piezoelectric substrate 2 to the center.

In the piezoelectric vibrating device 1, vibrating is excited in a region where the vibrating electrodes 3 and 4 are overlapped with each other by applying an AC voltage between the vibrating electrodes 3 and 4.

However, in the piezoelectric vibrating device 1 shown in FIG. 2, significant ripples are liable to be produced in a frequency region between the resonance frequency and the antiresonance frequency. More specifically, the production rate of the ripples is approximately 30 to 50%. The production of the above ripples is considered to be due to the non-uniformity of the shape of the vibrating electrodes 3 and 4. The vibrating electrodes 3 and 4 are applied by methods such as a method of printing and baking a conductive paste or a method of evaporating a metal material on the entire surface followed by etching.

In firing ceramics, however, a lot of pores appear on the surface of a sintered body. Accordingly, even if it is desired to form electrodes having a predetermined shape, the pores make it actually difficult to form electrodes having a uniform thickness and a desired shape. Further, in some cases, outer peripheral edges of the vibrating electrodes 3 and 4 may be blotted in printing or the edge portions may be irregular in etching. Furthermore, the edges of the vibrating electrodes 3 and 4 may be, in some cases, irregular by a cutting edge when the piezoelectric vibrating device 1 shown in FIG. 2 is cut down from a mother substrate.

More specifically, the above described ripples in the frequency region between the resonance frequency and the antiresonance frequency are considered to be due to the fact that the vibrating electrodes 3 and 4 are not formed in an exactly desired shape. Moreover, the deviation from the designed shape of the electrodes is not uniform. Consequently, the ripples are not produced in a uniform manner.

SUMMARY OF THE INVENTION

Accordingly, an object of the present invention is to provide a piezoelectric vibrating device capable of effectively preventing the production of ripples in a frequency region between the resonance frequency and the antiresonance frequency, and having stable vibrating characteristics.

According to the present invention, there is provided a piezoelectric vibrating device utilizing a thickness shear vibration mode, which has a structure in which at least one pair of vibrating electrodes is formed on both major surfaces of a piezoelectric substrate so as to have regions opposed to each other through the piezoelectric substrate and an edge of the vibrating electrode on one of the major surfaces which exists in the region opposed to the vibrating electrode on the other major surface is provided with irregularities.

In the present invention, at least one of the edges, which exist in the vibrating region, of the vibrating electrodes are provided with irregularities in view of the fact that the edges, which exist in the vibrating region, of the vibrating electrodes are not reliably formed in a desired shape, thereby to reduce the amount of fluctuations of the overlapping area of the vibrating electrodes which are overlapped with each other through the piezoelectric substrate. According to the present invention, therefore, the fluctuations of the overlapping area of the vibrating electrodes can be reduced, thereby to make it possible to reduce the production rate of ripples in the frequency region between the resonance frequency and the antiresonance frequency. Accordingly, a piezoelectric vibrating device having stable characteristics can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
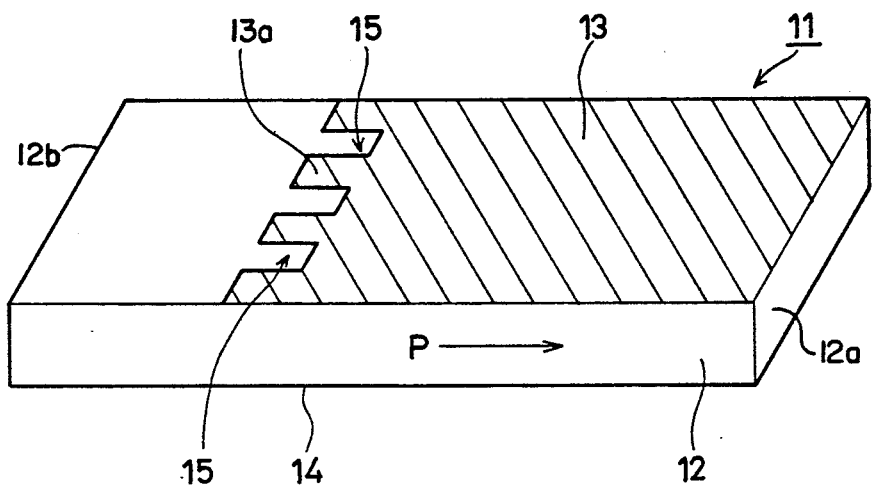
FIG. 1 is a perspective view showing a piezoelectric vibrating device according to one embodiment of the present invention.

FIG. 1 is a perspective view showing a piezoelectric vibrating device according to one embodiment of the present invention. This piezoelectric vibrating device 11 has a structure in which vibrating electrodes 13 and 14 are formed on both major surfaces of a rectangular piezoelectric substrate 12 which is subjected to polarization processing in the direction of an arrow P.

The vibrating electrode 13 is extended from one end 12a of the piezoelectric substrate 12 from the center, while the vibrating electrode 14 is extended from the other end 12b to the center. The vibrating electrodes 13 and 14 are opposed to each other through the piezoelectric substrate 12 in a central region of the piezoelectric substrate 12, to constitute a vibrating region.

Meanwhile, a plurality of notches 15 are formed at an edge 13a, which exists in the vibrating region, of the vibrating electrode 13, thereby to provide the edge 13a with irregularities. An edge, which exists in the vibrating region, of the vibrating electrode 14 is also provided with similar irregularities, which are not particularly shown in FIG. 1.

Figure 3A:
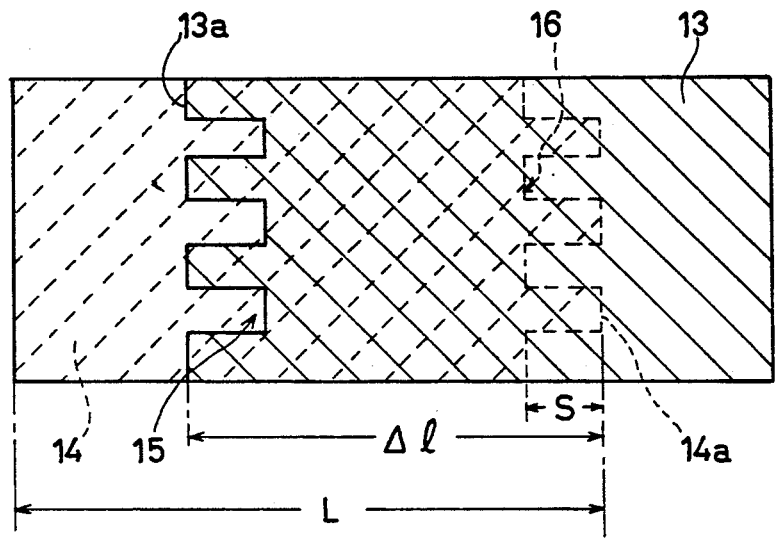
FIGS. 3A and 3B are plan views for explaining a state where vibrating electrodes are overlapped with each other in the embodiment and in the conventional example, respectively.

Referring to FIG. 3A, the function and effect due to the above described provision of the irregularities will be described.

FIG. 3A is a plan view showing the piezoelectric vibrating device 11 shown in FIG. 1. Notches 15 and 16 as described above are respectively formed at the edge 13a of the vibrating electrode 13 and the edge 14a of the vibrating electrode 14, to provide irregularities.

On the other hand, in the actual process for forming electrodes, the vibrating electrodes 13 and 14 hardly formed reliably in a shape as shown, and the edges 13a and 14a may be, in many cases, deformed by a blot in the printing step, inferior etching or the like. In such a case, even if slight irregularities and pores appear at the edges 13a and 14a, the overlapping area of both the vibrating electrodes 13 and 14 does not largely fluctuate because the edges 13a and 14a of the vibrating electrodes 13 and 14 are originally provided with irregularities in the present embodiment.

More specifically, in the present embodiment, the edges 13a and 14a, which exist in the vibrating region of the vibrating electrodes 13 and 14 are provided with irregularities, thereby to make it possible to reduce fluctuations of the overlapping area of both the vibrating electrodes 13 and 14 even if the electrodes are not formed exactly as designed.

The above described function and effect will be described on the basis of an example of a specific experiment. Let's consider a case where a piezoelectric substrate having a plane shape of 6.7 × 1.0 mm and having a thickness of 305 mm is used as the piezoelectric substrate 12, the length L of the vibrating electrodes 13 and 14 is set to 4.2 mm and the overlapping size $\Delta l$ of both the vibrating electrodes 13 and 14 is set to 0.9 to 2.1 mm (see FIG. 3A). In this case, if the depth S of the notches 15 and 16 is set to 0.1 to 0.3 mm, the production rate of ripples between the resonance frequency and the antiresonance frequency is 10 to 30% in the structure of the piezoelectric vibrating device according to the present embodiment.

Figure 2:
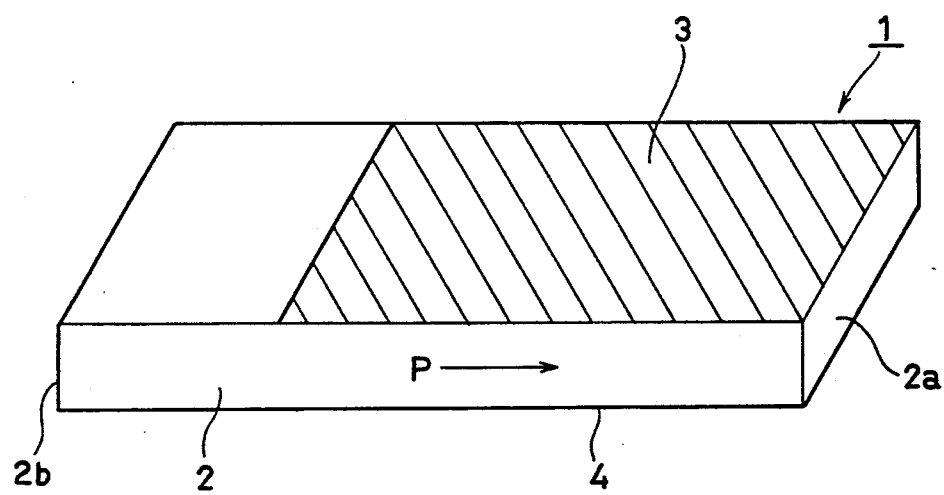
FIG. 2 is a perspective view showing a conventional piezoelectric vibrating device.
Figure 3B:
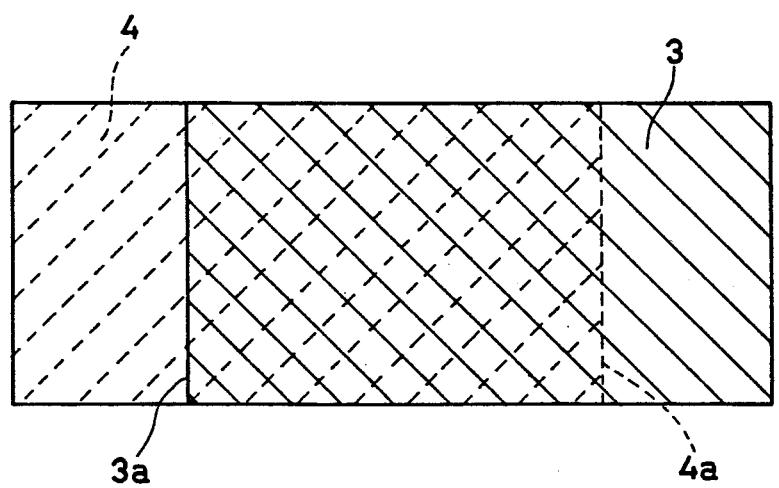

On the other hand, in the conventional example of FIG. 2 showing the piezoelectric vibrating device of appreciable size, the production rate of ripples is significantly large, for example, 30 to 50%. This is considered to be due to the fact that the overlapping area largely fluctuates by the collapse of electrodes in actually forming the electrodes because edges 3a and 4a of the vibrating electrodes 3 and 4 are formed in a linear shape in the conventional example, as schematically shown in FIG. 3B.

Figure 4A:
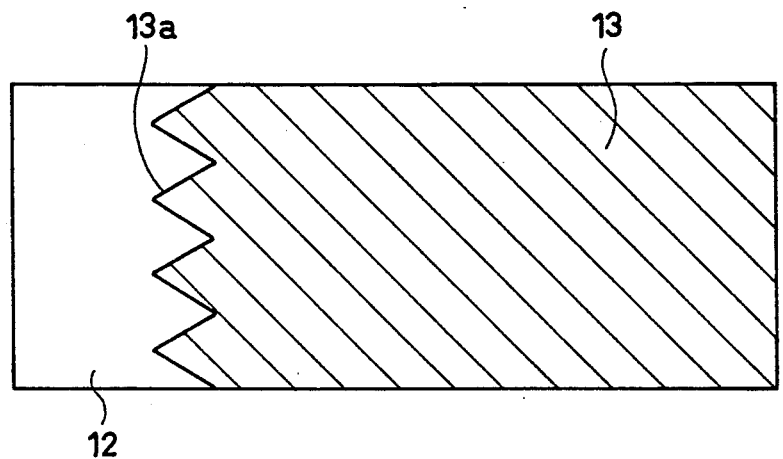
FIGS. 4A and 4B are plan views for explaining other examples of the shape of irregularities provided for edges of vibrating electrodes, respectively.
Figure 4B:
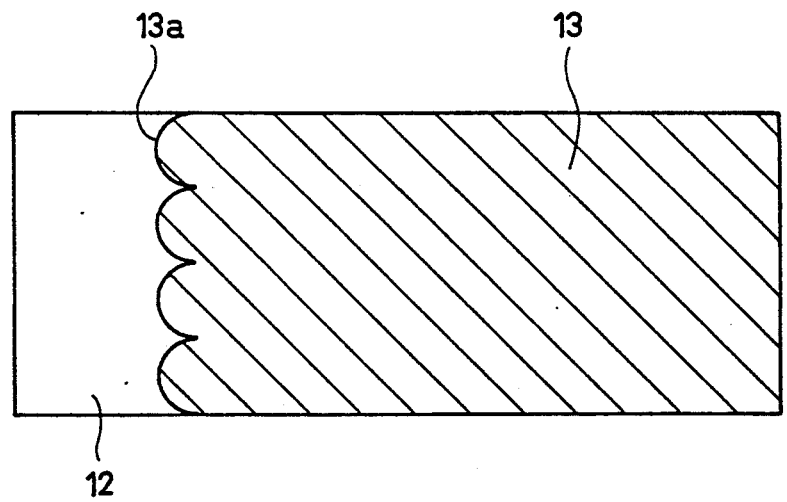

Although in the piezoelectric vibrating device 11 according to the embodiment shown in FIG. 1, a plurality of notches 15 and 16 are formed in the vibrating electrodes 13 and 14, thereby to provide irregularities for edges 13a and 14a, which exist in the vibrating region, of the vibrating electrodes, the shape for providing the irregularities is not limited to the same. For example, the edge 13a of the vibrating electrode 13 may be formed in a serrated shape as shown in FIG. 4A or the edge 13a of the vibrating electrode 13 may be formed in such a shape that a plurality of circular arcs are arranged as shown in FIG. 4B, to provide irregularities.

Furthermore, the present invention is applied not only to the piezoelectric vibrating device having the structure shown in FIG. 1 but also to a piezoelectric resonator, a piezoelectric filter and the like in general utilizing a thickness shear vibration mode. As an example, the present invention is also applicable to a piezoelectric filter shown in FIGS. 5A and 5B.

Figure 5A:
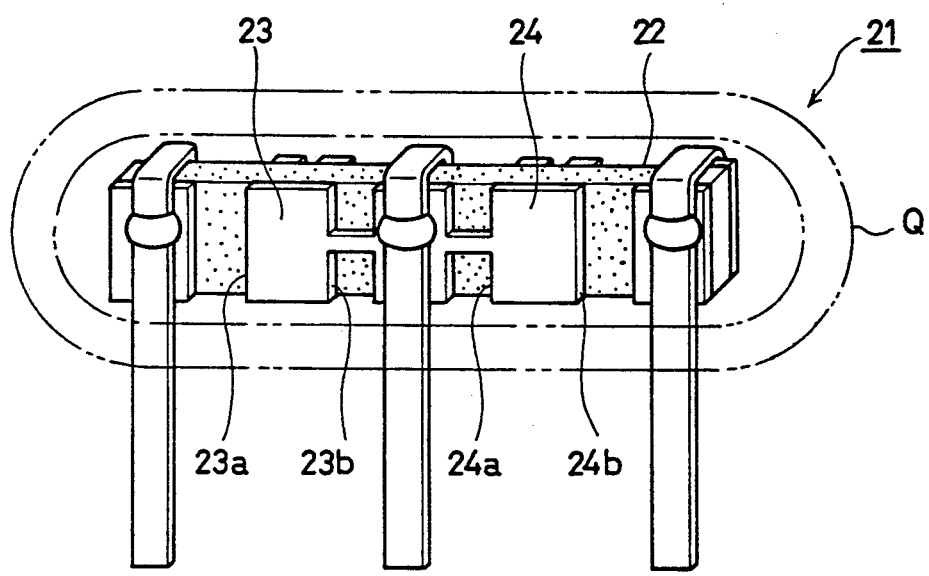
FIGS. 5A and 5B are perspective views as respectively seen from the forward side and the backward side for explaining a piezoelectric filter serving as another example of a piezoelectric vibrating device to which the present invention is applied.
Figure 5B:
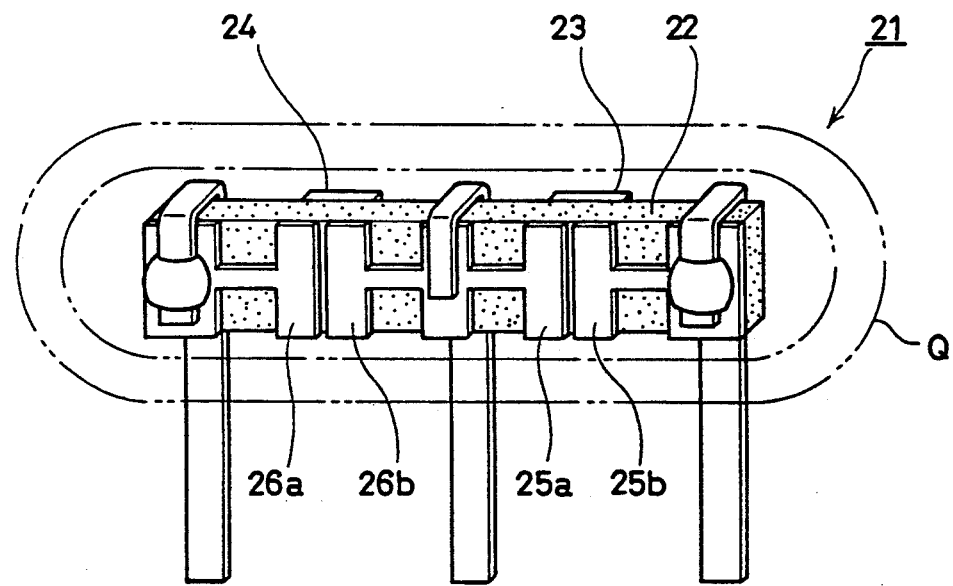

FIGS. 5A and 5B are perspective views as respectively seen from the forward side and the backward side for explaining a piezoelectric filter to which the present invention is applied. In FIGS. 5A and 5B, a piezoelectric filter 21 is constructed using a rectangular piezoelectric substrate 22. The piezoelectric substrate 22 is subjected to polarization processing in the direction parallel to its major surfaces, and common electrodes 23 and 24 are formed on one of the major surfaces and vibrating electrodes 25a, 25b, 26a, and 26b are formed on the other major surfaces so as to be opposed to the common electrode 23 or 24. In this structure, the common electrode 23 serving as a vibrating electrode and the vibrating electrodes 25a and 25b constitute on three-terminal type piezoelectric filter and the common electrode 24 and the vibrating electrodes 26a and 26b further constitute one piezoelectric filter. In each of the piezoelectric filters, if edges, which exist in a vibrating region, of the vibrating electrodes 25a and 25b or 26a and 26b and edges of the common electrodes 23 and 24 (for example, the edges 23a and 23b and the edges 24a and 24b) are provided with irregularities according to the present invention, the effect of the present invention can be obtained.

In FIGS. 5A and 5B, a two dot and dash line Q denotes a portion which is sheathed by resin.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric vibrating device utilizing a thickness shear vibration mode, comprising:
   a piezoelectric substrate having opposite surfaces including a vibrating region, said substrate being elongated in a longitudinal direction; and
   at least one pair of vibrating electrodes formed on said surfaces so as to be opposite to each other through said substrate at least in said vibrating region, at least one of said vibrating electrodes having an edge extending transversely to said longitudinal direction in said vibrating region, said edge having notches which are formed generally in said longitudinal direction.

2. The piezoelectric vibrating device of claim 1 wherein both of said pair of vibrating electrodes have a notched edge extending transversely to said longitudinal direction in said vibrating region.

3. The piezoelectric vibrating device of claim 1 wherein said substrate is rectangular.

4. The piezoelectric vibrating device of claim 1 wherein said notches are rectangular.

5. The piezoelectric vibrating device of claim 1 wherein said notches provide said edge with a serrated shape.

6. The piezoelectric vibrating device of claim 1 wherein said notches provide said edge with a pattern of mutually connected circular arcs.

* * * * *